US008896401B1

(12) United States Patent (10) Patent No.: US 8,896,401 B1
Tsironis (45) Date of Patent: Nov. 25, 2014

(54) CALIBRATION AND TUNING USING COMPACT MULTI FREQUENCY-RANGE IMPEDANCE TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 2 days.

(21) Appl. No.: 13/845,607

(22) Filed: Mar. 18, 2013

Related U.S. Application Data

(62) Division of application No. 12/662,391, filed on Apr. 14, 2010, now Pat. No. 8,410,862.

(51) Int. Cl.
*H03H 7/38* (2006.01)
*H03H 7/40* (2006.01)

(52) U.S. Cl.
CPC .. *H03H 7/40* (2013.01); *H03H 7/38* (2013.01)
USPC ......................................... 333/263; 333/17.3

(58) Field of Classification Search
USPC .................... 333/263, 17.3, 32, 33
See application file for complete search history.

(56) References Cited

U.S. PATENT DOCUMENTS

| 6,674,293 | B1 | 1/2004 | Tsironis |
| 7,135,941 | B1 | 11/2006 | Tsironis |
| 7,646,267 | B1 | 1/2010 | Tsironis |
| 8,212,629 | B1 | 7/2012 | Tsironis |

OTHER PUBLICATIONS

"Computer Controlled Microwave Tuner, CCMT," Product Note 41, Focus Microwaves Inc., Jan. 1998, www.focus-microwaves.com.
"Sprague AIRTRIM 1-16pF resonance up to 5GHz," Catalogue, Apr. 2, 2010.
"Computer Design of Microwave Circuits," K.C.Gupta et al, Appl 2.1 case 7, Artech House, 1981.
"Variable Capacitor," datasheet, Ocean State Electronics, Apr. 2, 2010.

*Primary Examiner* — Stephen Jones

(57) ABSTRACT

A calibration and impedance synthesis method applies to automatic multi frequency-range electro-mechanical impedance tuner which cover frequencies from a low megahertz to a high gigahertz range; this is possible by cascading a high frequency tuner module with one or two low frequency tuner modules; the low frequency module(s) are made using either "variable phase shifter-capacitor" or "multi-capacitor-transmission line tuner" structures. The high frequency module is a single, double or triple probe slide screw tuner, with the individual probes covering adjacent frequency bands. Calibration is measuring S-parameters of each tuner module on a VNA, cascading in memory and saving in cal-files. Tuning employs search routines in calibration data base targeting the closest calibrated point versus a user defined impedance.

9 Claims, 28 Drawing Sheets

Structure of wideband tuner using a cascade of a slide screw tuner and a low frequency;
the low frequency tuner can be bypassed using an (optional) bypass capacitor.

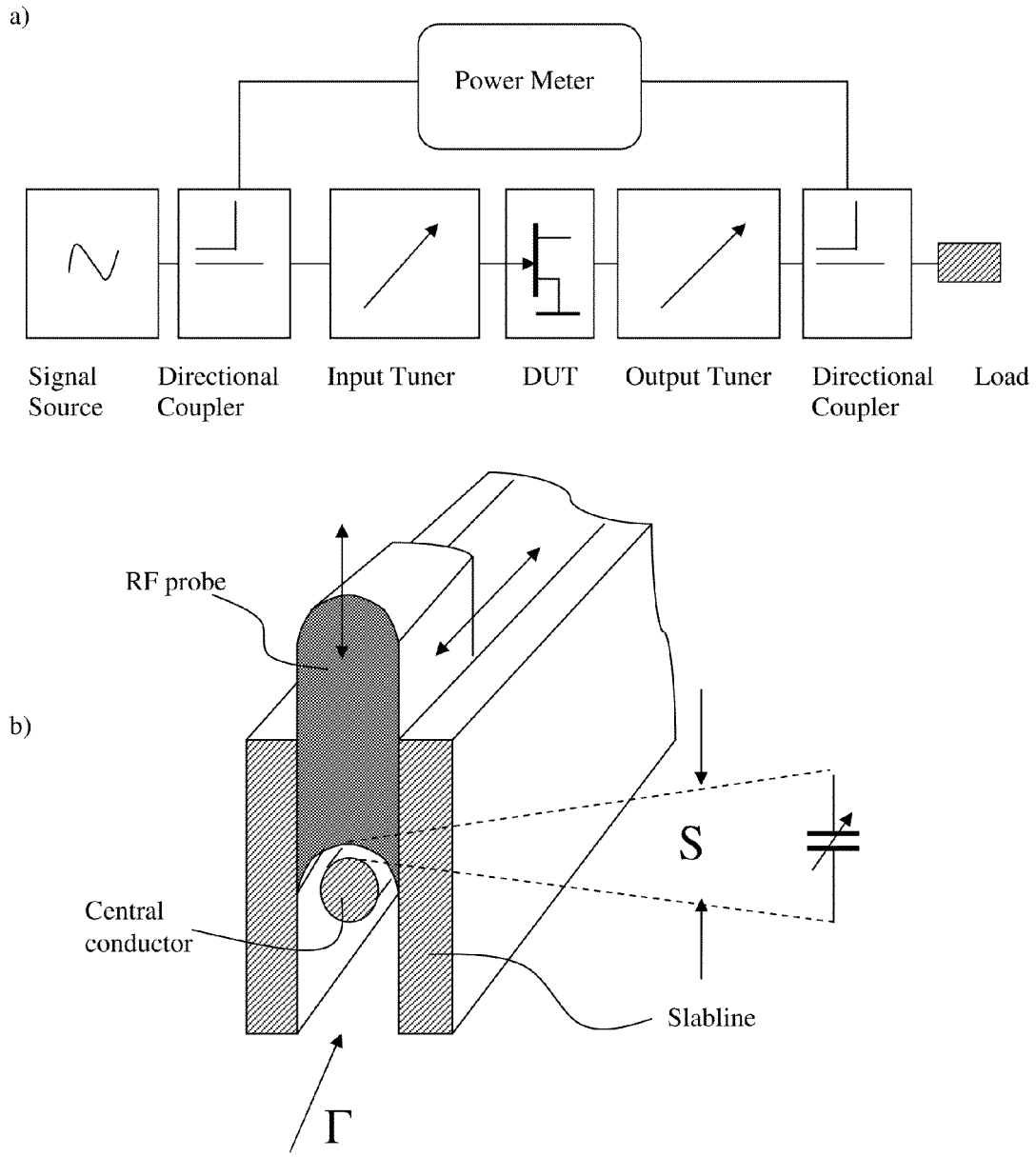
FIG. 1, prior art: a) typical load pull setup using impedance tuners; b) Cross section of electro-mechanical slide screw tuner

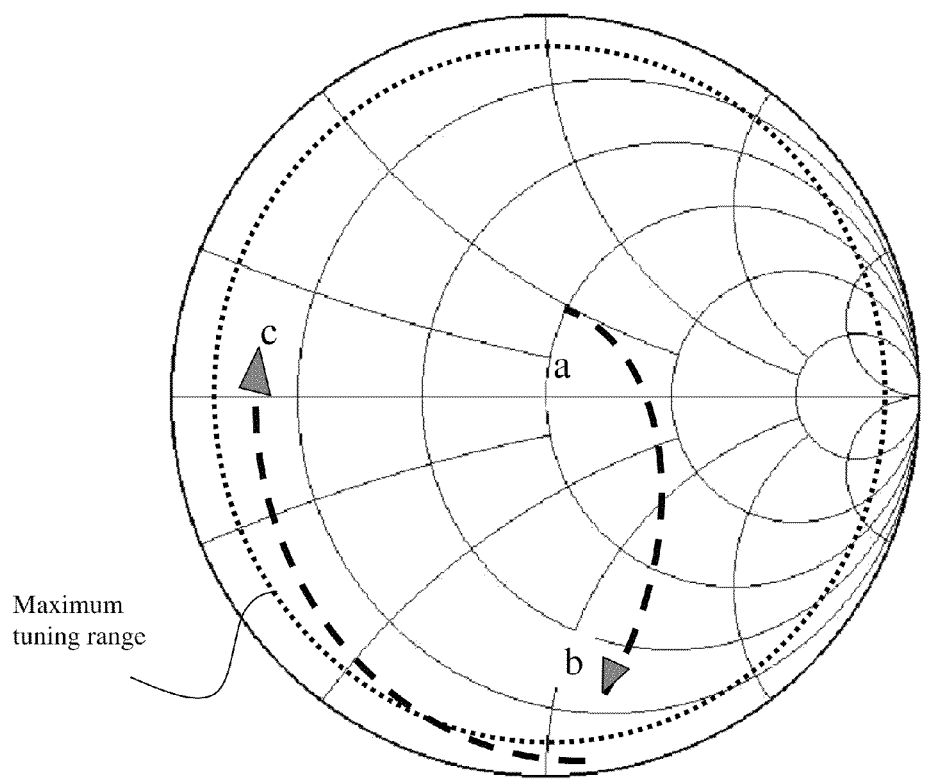
FIG. 1c, prior art: Tuning mechanism of slide screw tuners

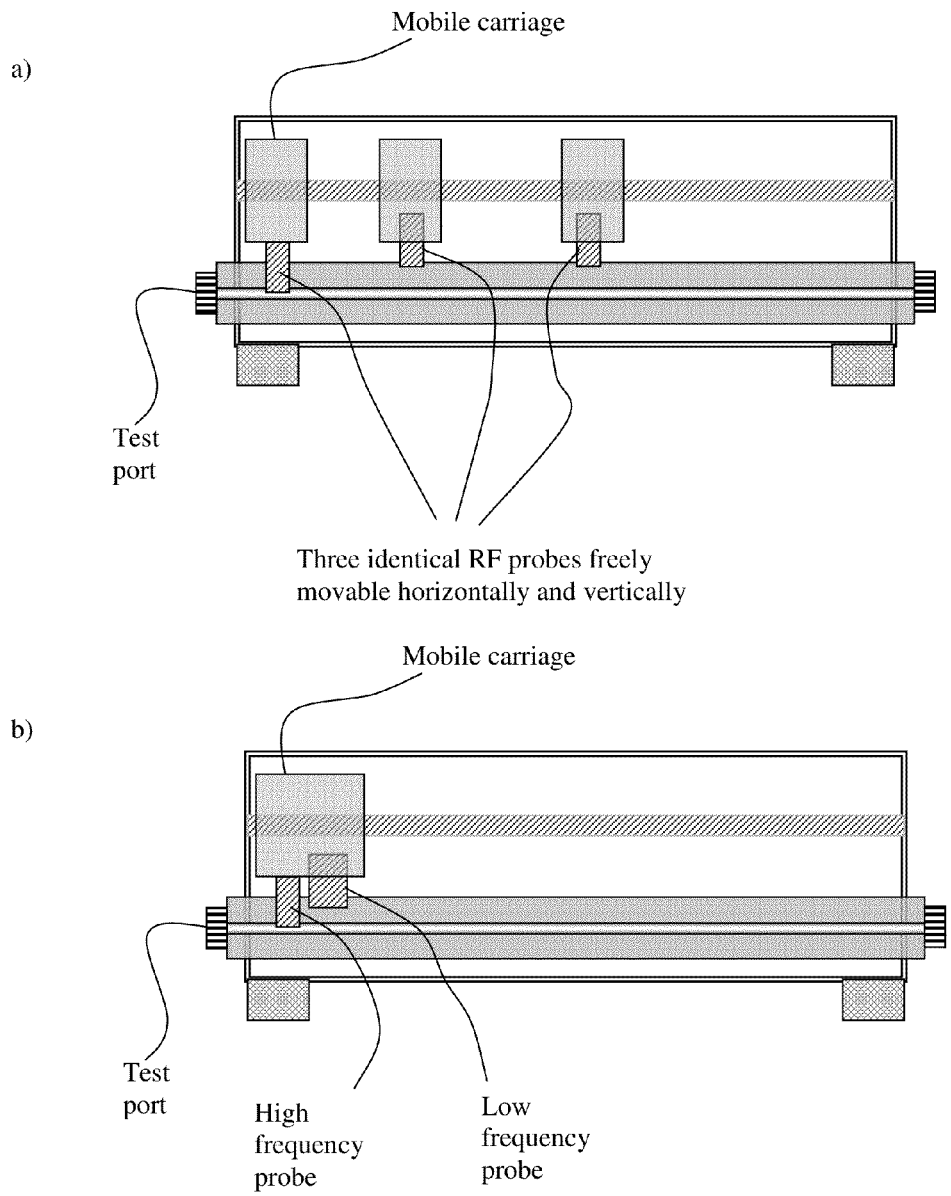
FIG. 2, prior art: a) triple probe tuner for ultra stable and harmonic tuning; b) wideband tuner using two RF probes.

a)
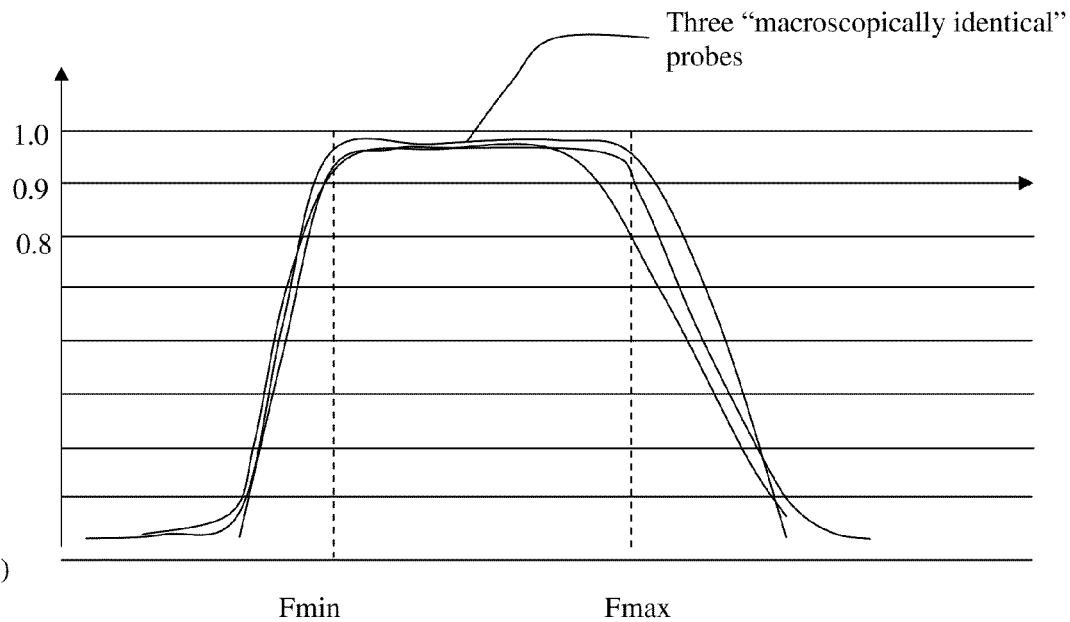
b)
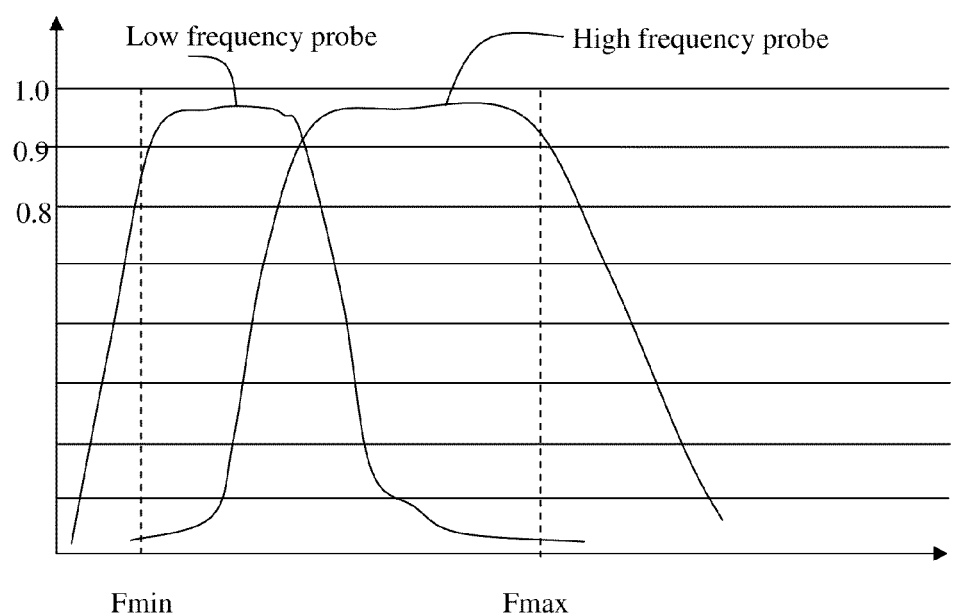
FIG. 3, prior art: a) frequency response of triple (identical probes) and b) double (different probes) tuners.

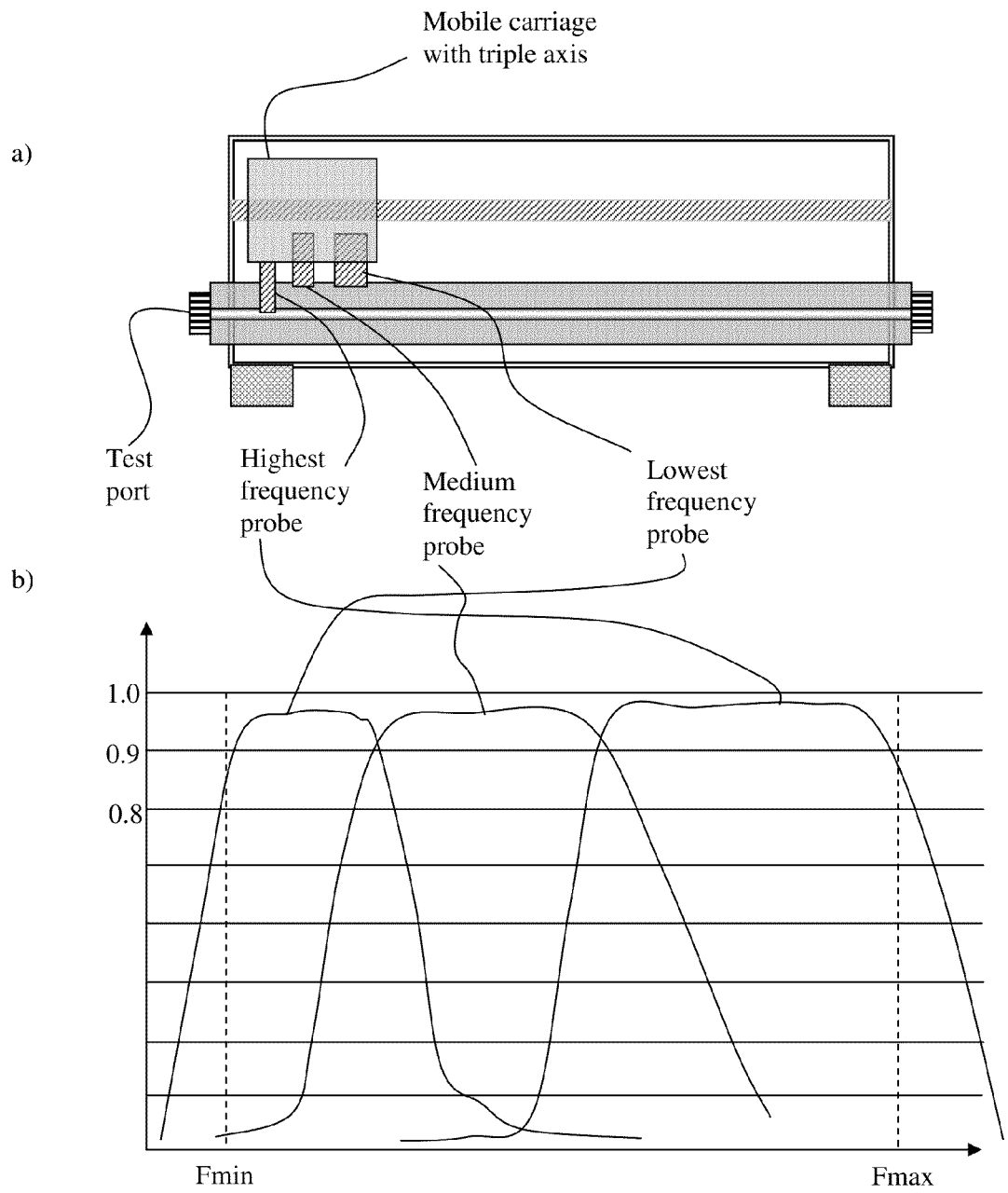
FIG. 4, prior art: a) Wideband tuner with triple carriage and three probes of different size covering adjacent frequency bands b).

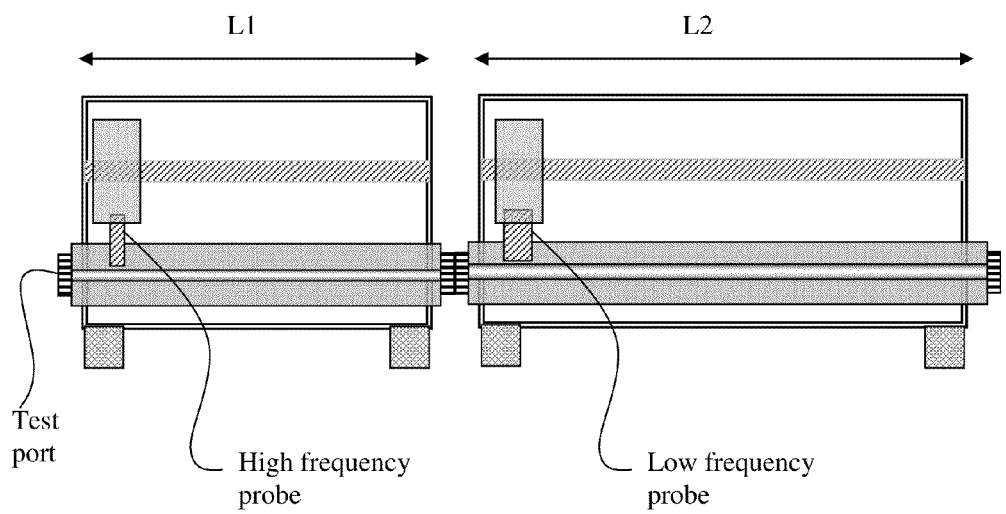
FIG. 5: Cascade of two tuners covering different frequency ranges.

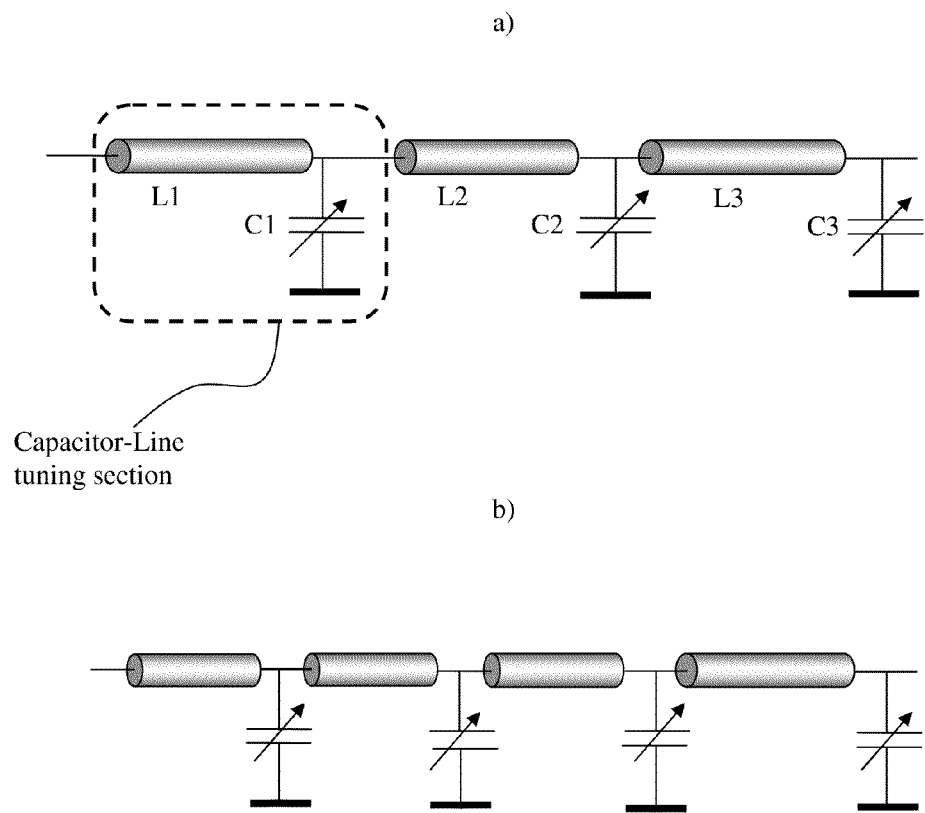
FIG. 6: three (a) (prior art) and four (b) "variable capacitor-transmission line" low frequency tuners.

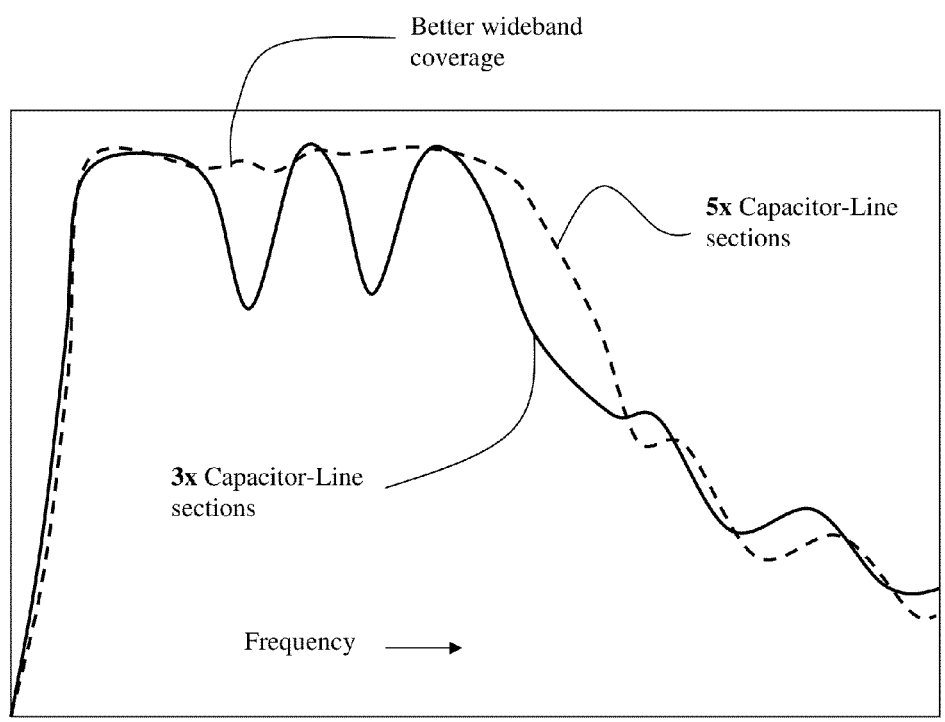
FIG.7: Frequency response of three (prior art) and five capacitor-line section, low frequency tuners

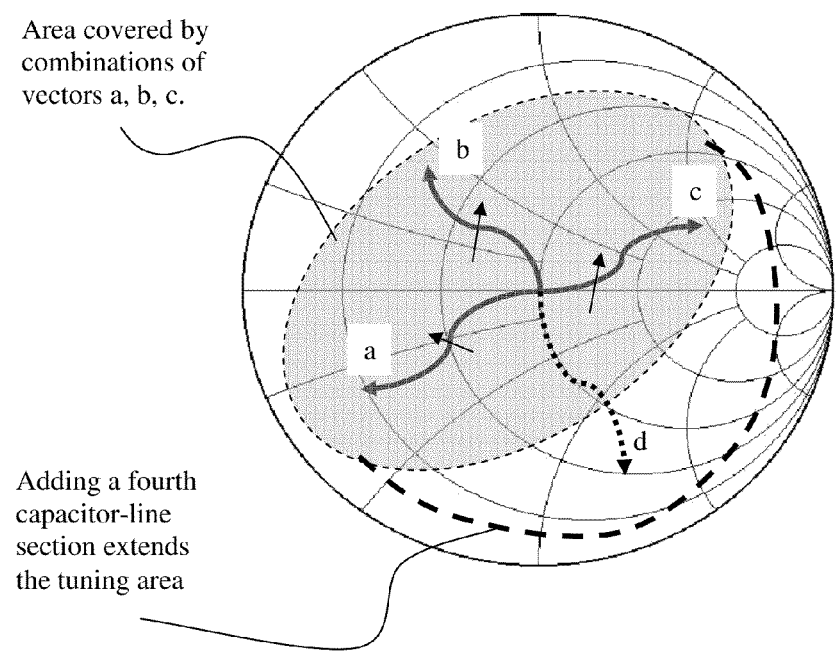
FIG. 8: Impedance coverage of three capacitor-line section tuner.

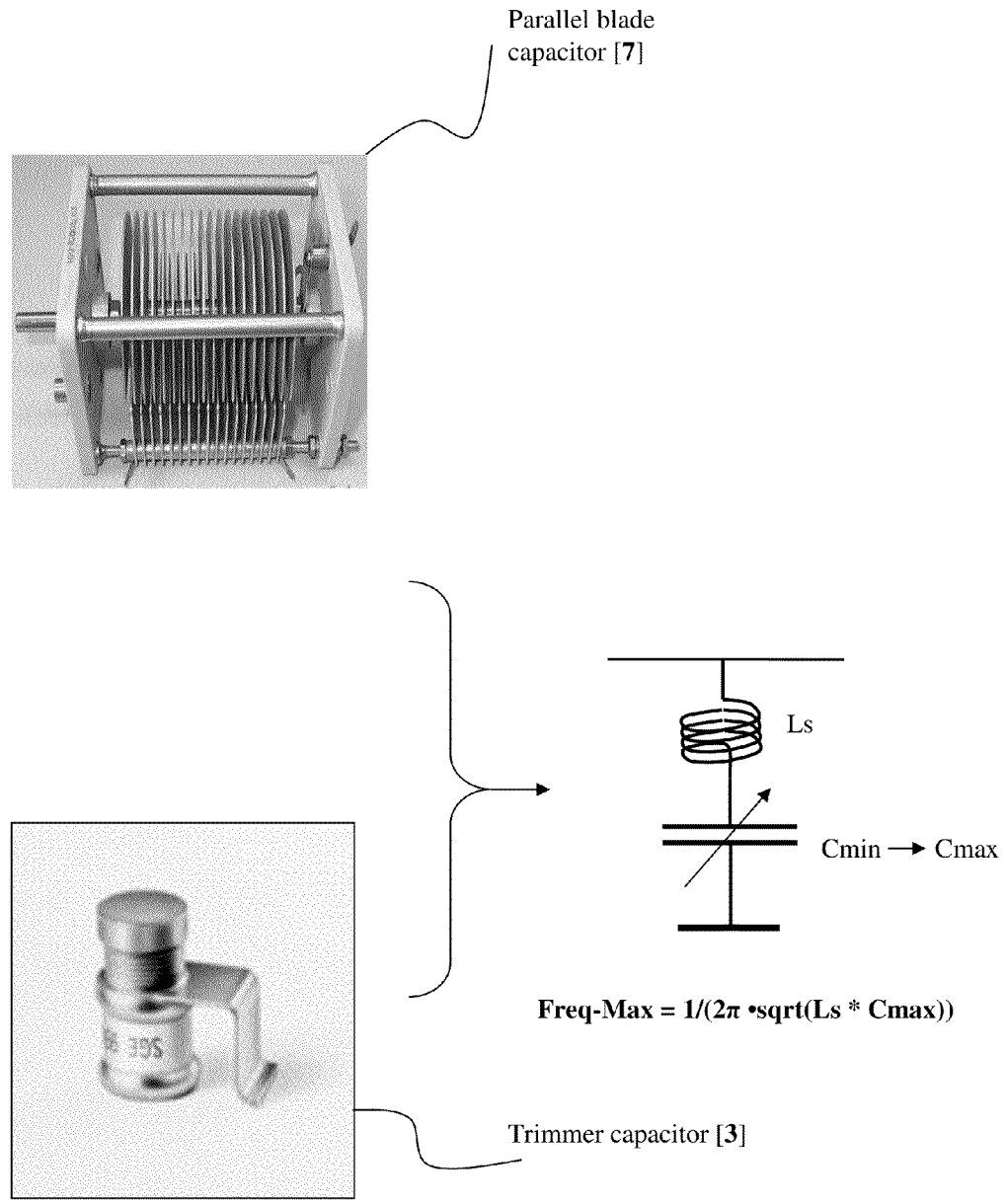
FIG. 9, prior art: Parallel blade and trimmer capacitors and their electrical RF equivalent circuit.

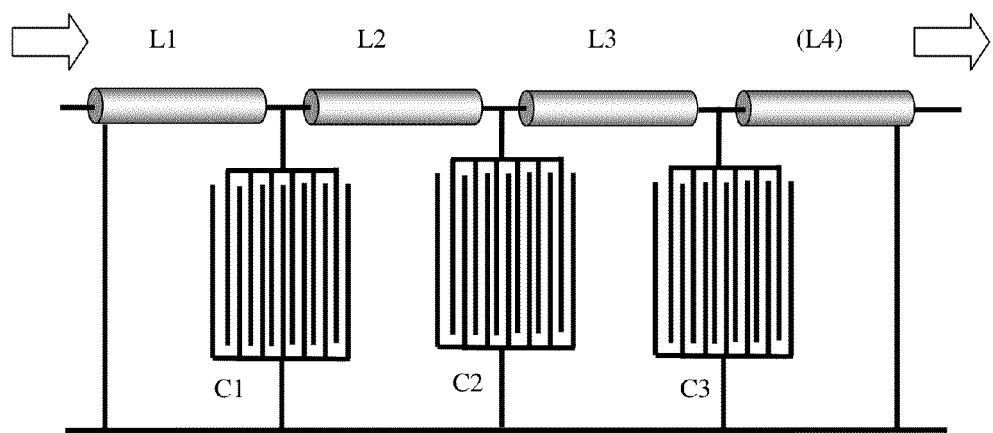
FIG. 10, prior art: structure of low frequency tuner using three variable parallel blade capacitors and three lengths of coaxial cable.

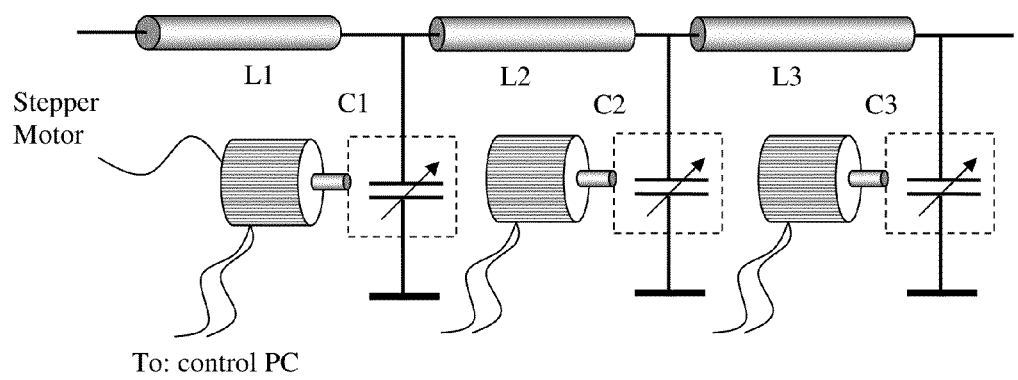
FIG.11, prior art: automated low frequency tuner, using stepper motors

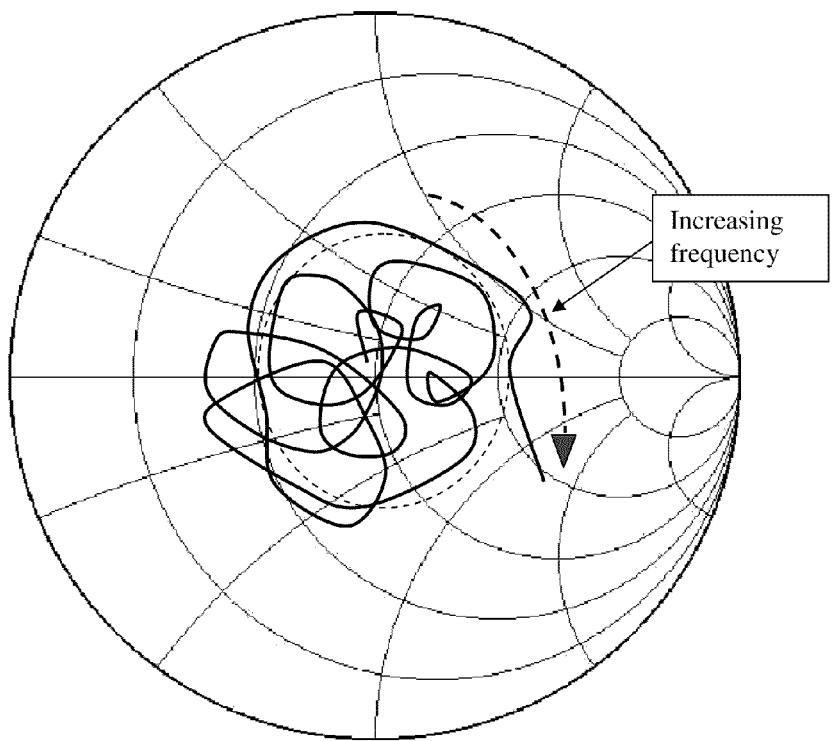
FIG. 12: Residual reflection of capacitor based low frequency tuner as a function of frequency, over a wide frequency range.

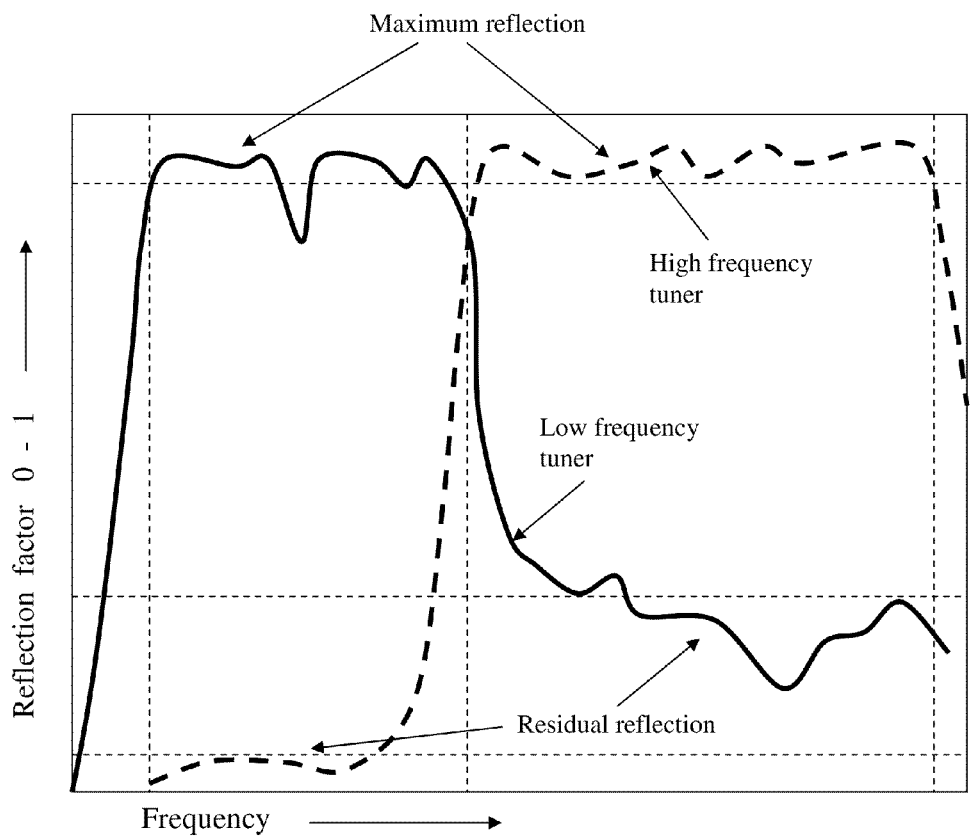
FIG. 13: Typical maximum and residual reflection of low frequency and high frequency tuners over the whole frequency range.

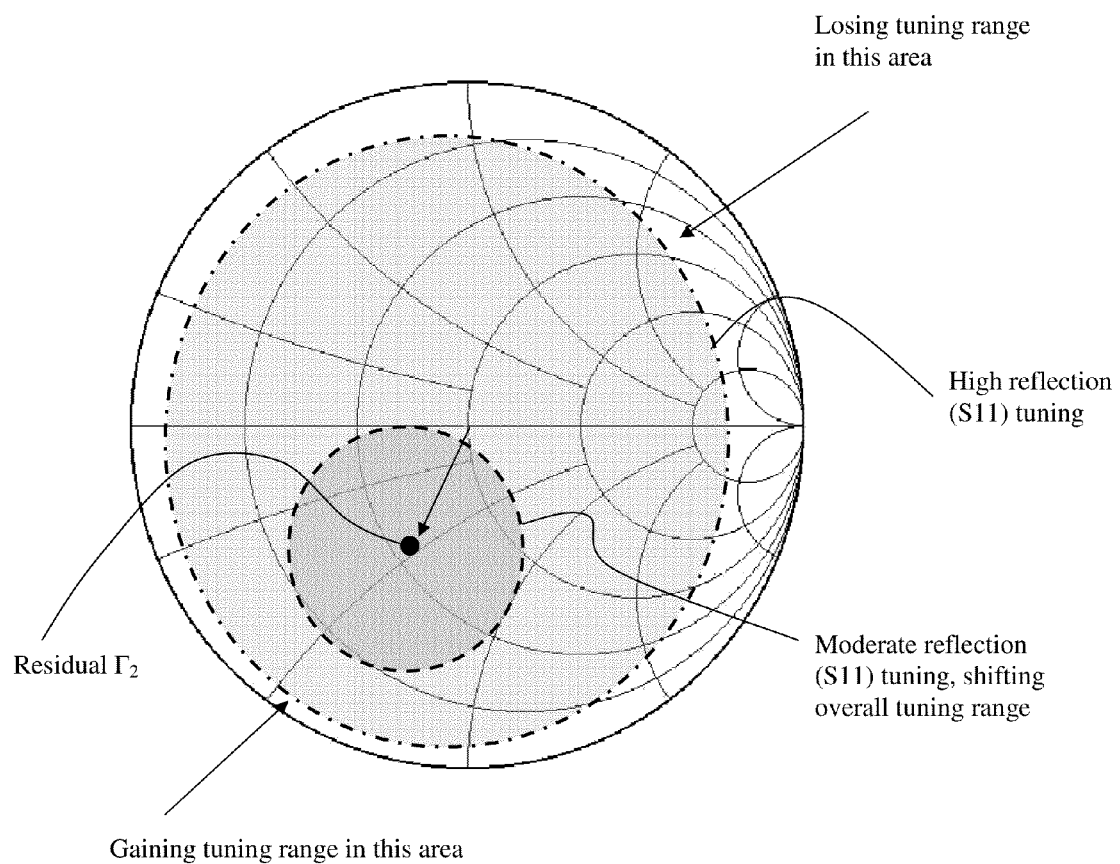
FIG. 14: Tuning capability of a cascade of a high frequency with a low frequency (with high residual reflection) tuner.

a)
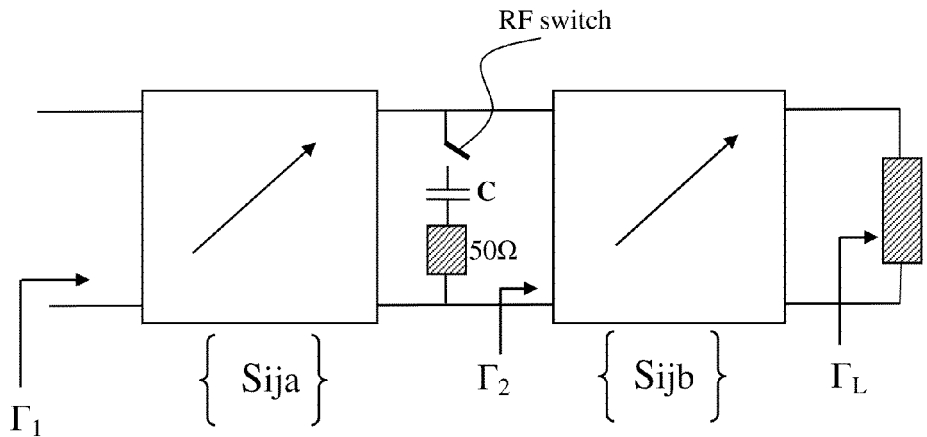
b)
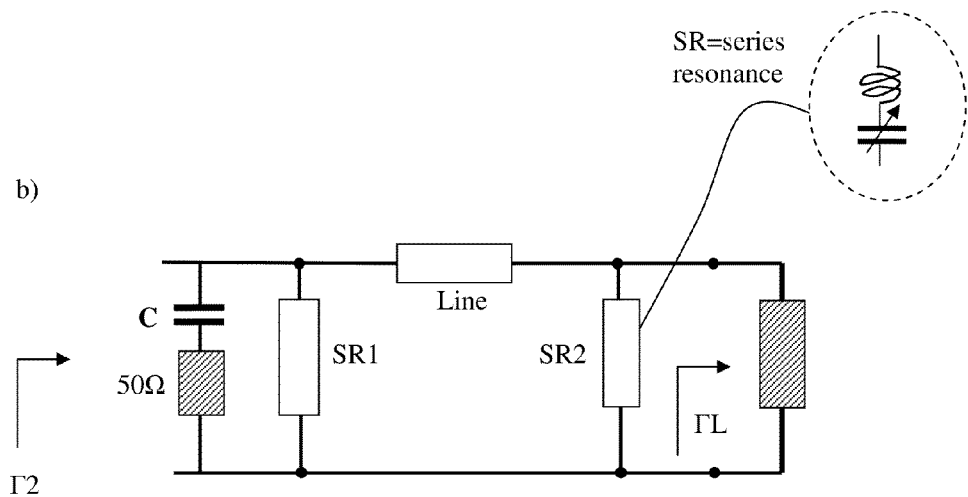
FIG. 15: a) Cascade of two impedance tuners [a] and [b] with possibility of bypassing the low frequency unit using a capacitor.

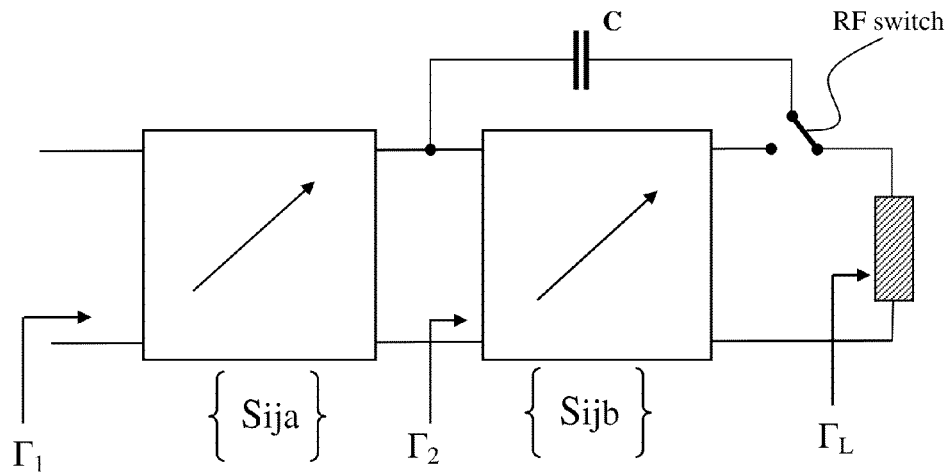
FIGURE 16a: Cascade of two impedance tuners [a] and [b] with possibility of bypassing the low frequency unit using a switchable capacitor C.
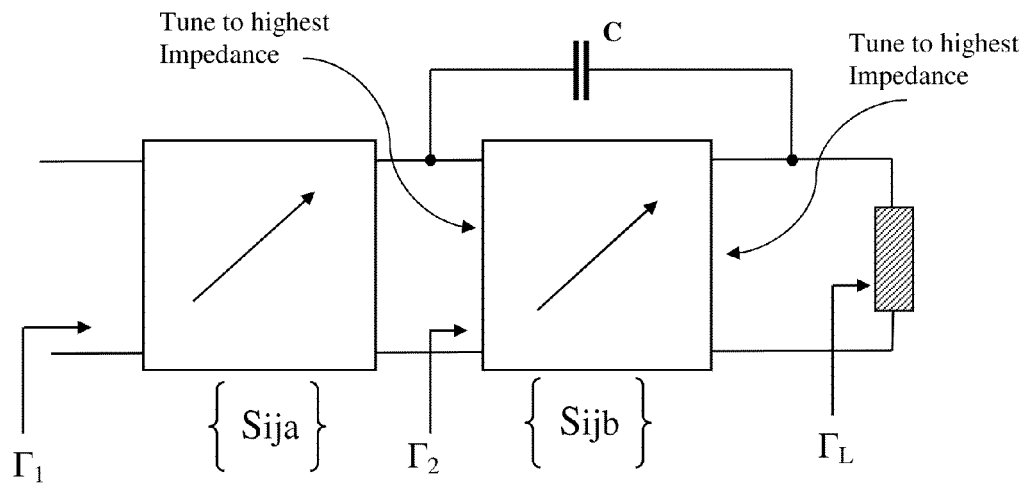
FIG. 16b: Cascade of two impedance tuners [a] and [b] with possibility of bypassing the low frequency unit using a permanent capacitor C.

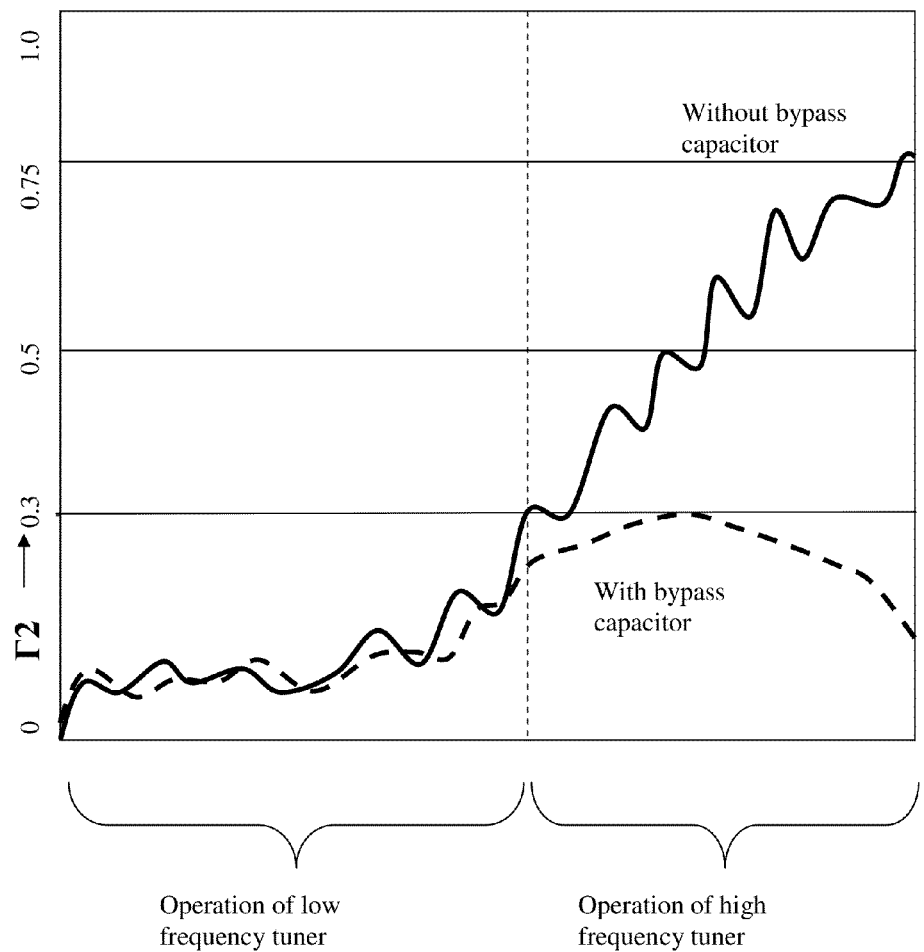
FIG. 16c: wideband frequency response of residual reflection of low frequency tuner, with and without bypass capacitor.

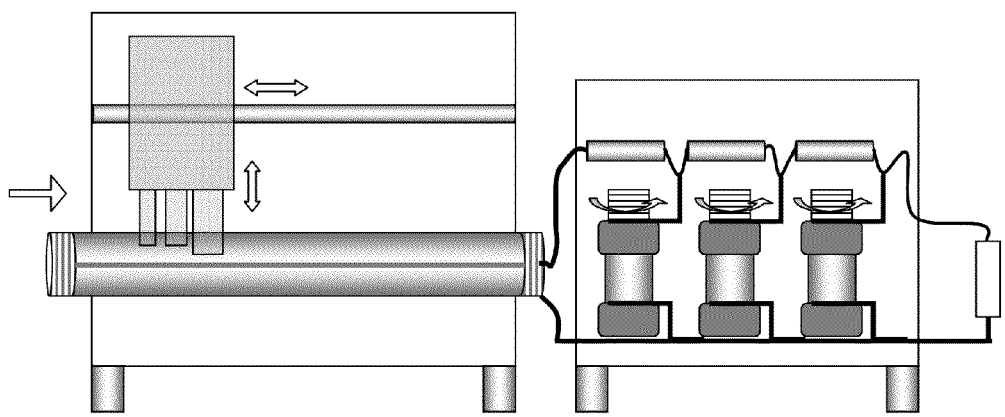
FIG. 17: Structure of wideband tuner using a cascade of a slide screw tuner and a low frequency tuner with three variable trimmer capacitors and three lengths of coaxial cable.

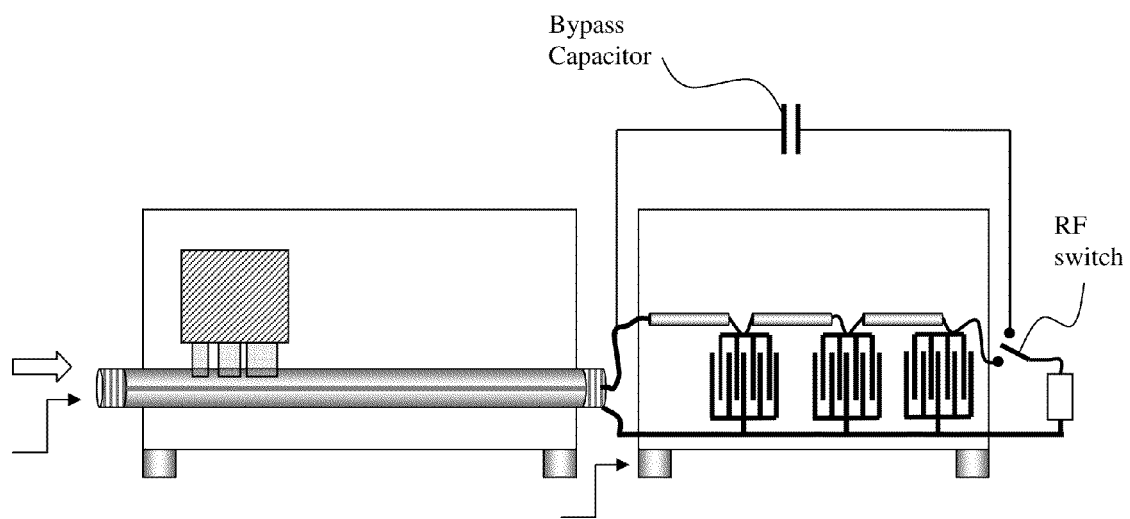
FIG.18: Structure of wideband tuner using a cascade of a wideband slide screw tuner with three variable parallel blade capacitors and lengths of coaxial cable.

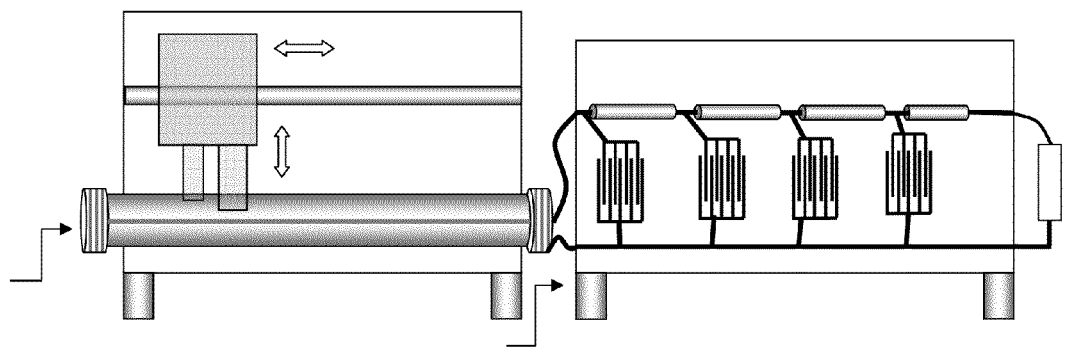
FIG. 19: Wideband tuner using a cascade of a slide screw tuner with two probes and a low frequency tuner with four variable parallel blade capacitors and four lengths of coaxial cable.

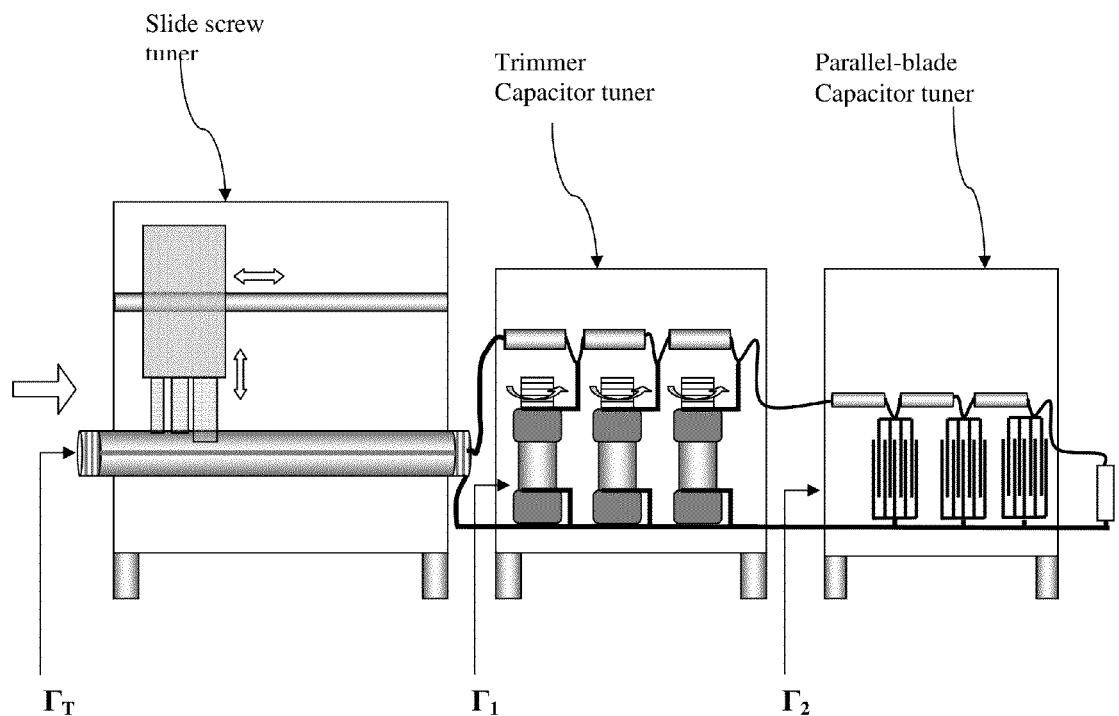
FIG. 20: Cascade of three tuner units, providing multi-decade frequency coverage

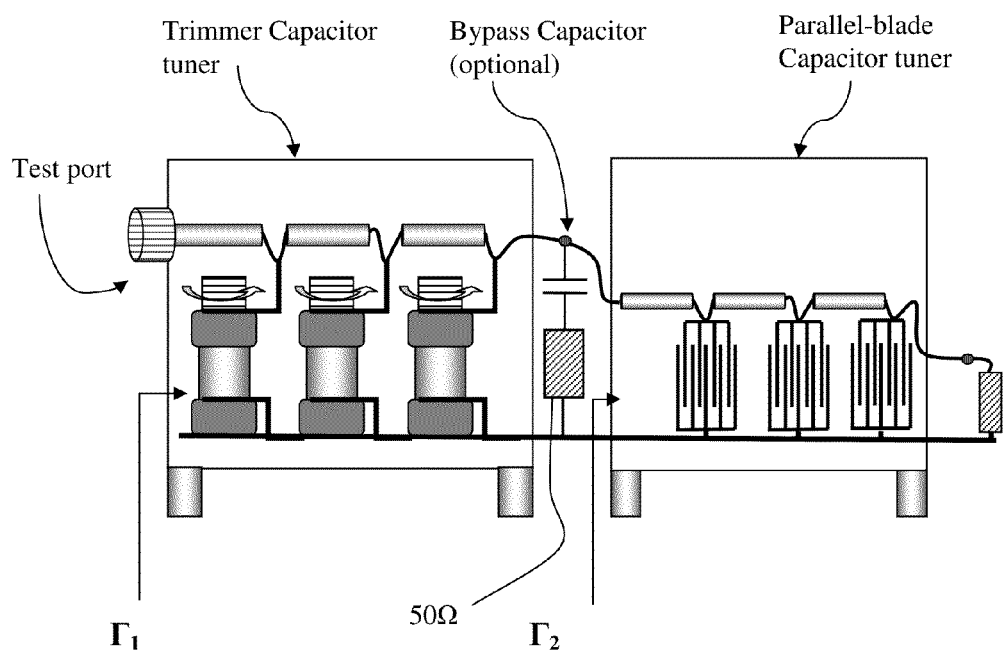
FIG. 21: Cascade of a trimmer based tuner with a parallel-blade capacitor tuner.

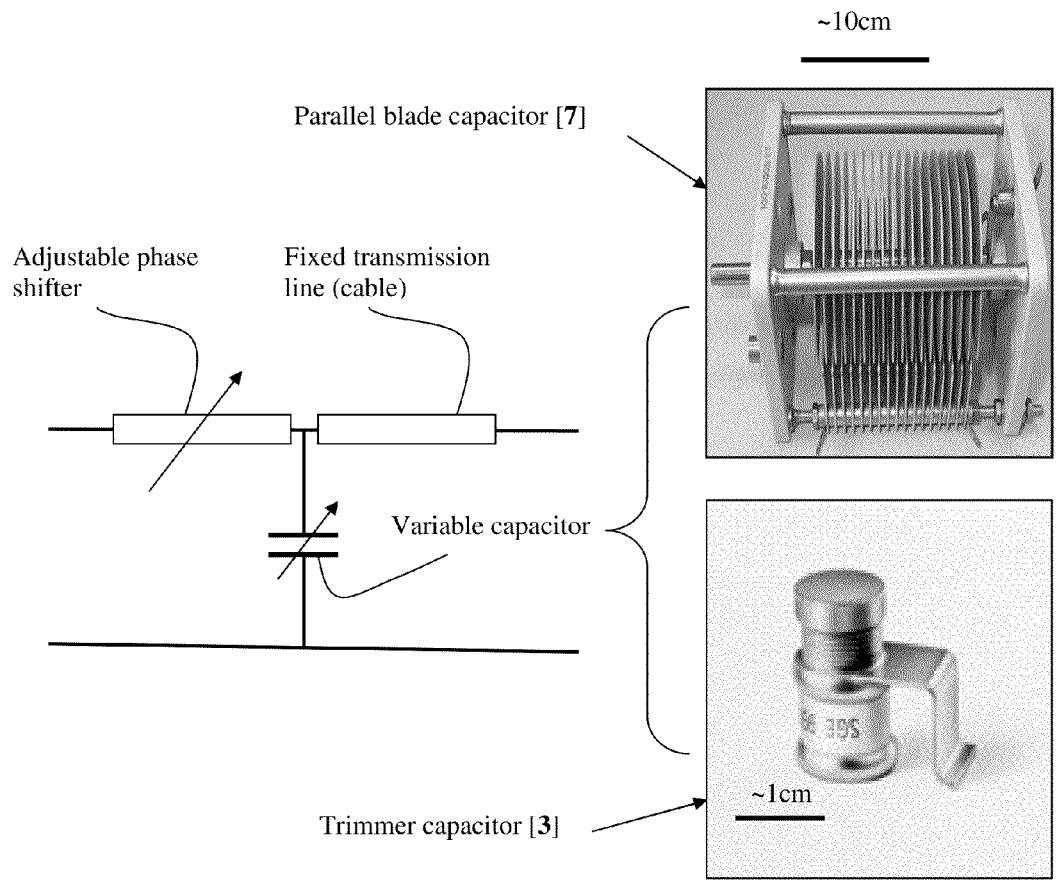
FIG. 22, prior art: Structure of low frequency tuner using a variable capacitor (parallel-blade [7] or trimmer [3], depending on the frequency range) and a variable in-line phase shifter [8].

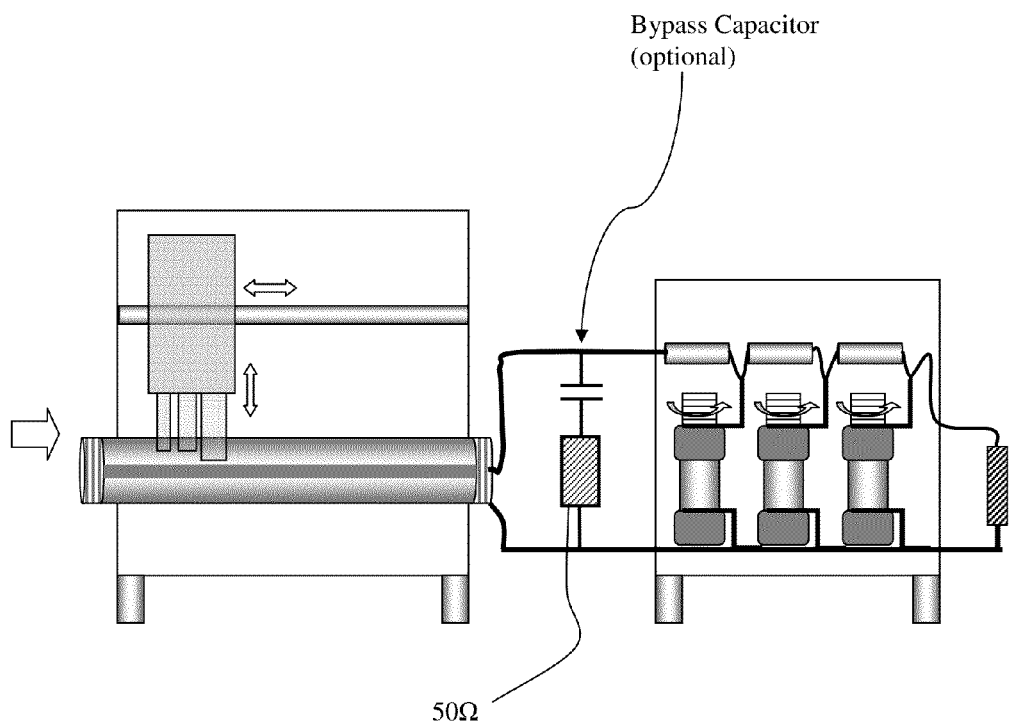
FIG. 23: Structure of wideband tuner using a cascade of a slide screw tuner and a low frequency; the low frequency tuner can be bypassed using an (optional) bypass capacitor.

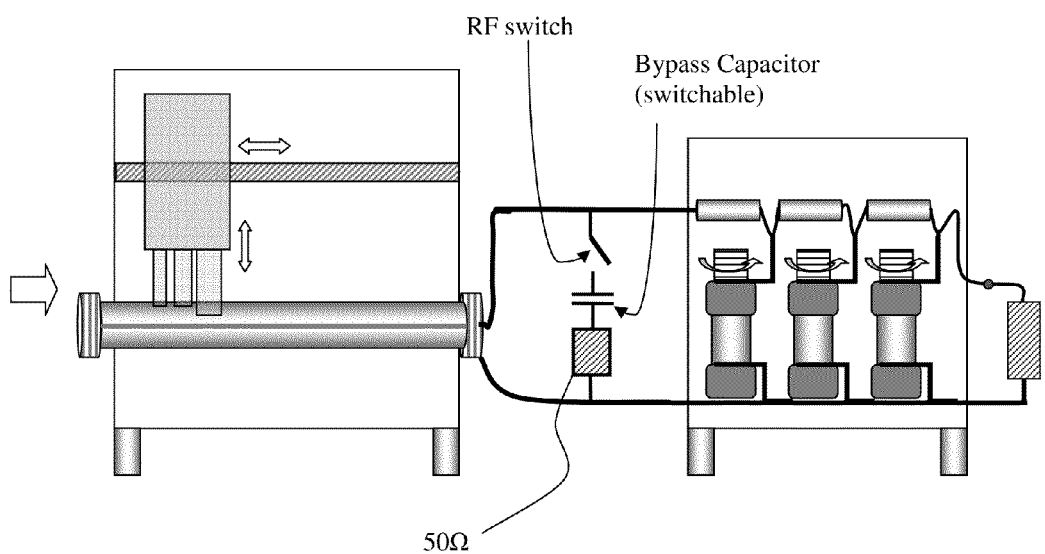
FIG. 24: Cascade of wideband high frequency tuner with low frequency tuner and capability of inserting a bypass capacitor.

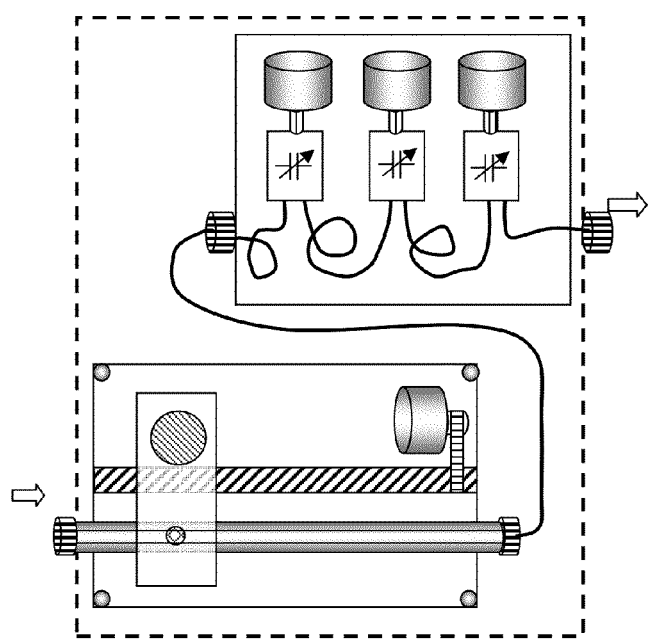
FIG. 25: Compact assembly of slide screw with capacitor based wideband tuners (top view).

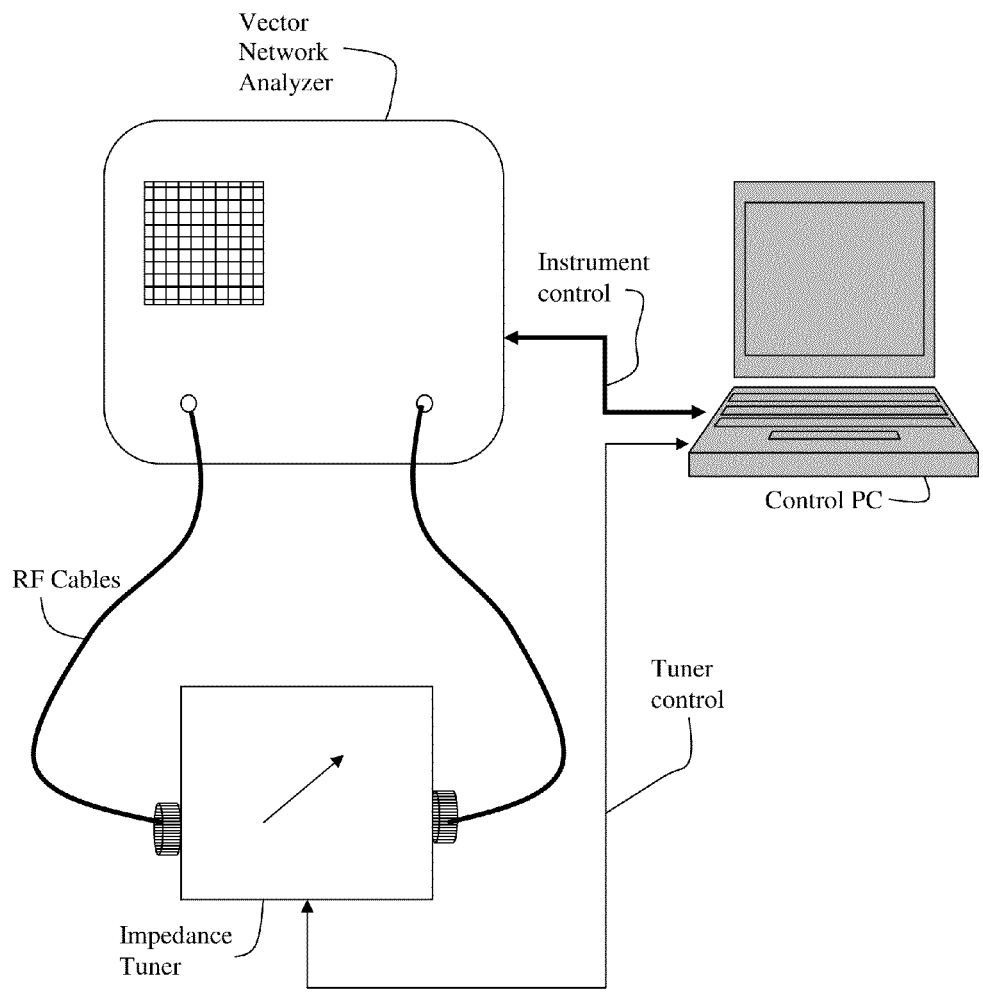
FIG. 26: Prior art, test setup for calibrating an impedance tuner on a vector network analyzer (VNA).

CALIBRATION AND TUNING USING COMPACT MULTI FREQUENCY-RANGE IMPEDANCE TUNERS

PRIORITY CLAIM

This application is a division of U.S. Non-Provisional patent application Ser. No. 12/662,391, filed Apr. 14, 2010, and titled COMPACT MULTI FREQUENCY-RANGE IMPEDANCE TUNER, which is incorporated herein by reference in its entirety.

CROSS-REFERENCE TO RELATED ARTICLES

[1] "Product Note #41: Computer Controlled Microwave Tuner, CCMT", Focus Microwaves Inc., January 1998.
[2] Tsironis, C. U.S. Pat. No. 6,674,293, "Adaptable Prematched tuner system and method".
[3] Catalogue: Sprague AIRTRIM 1-16 pF resonance up to 5 GHz.
[4] Computer Design of Microwave Circuits, K. C. Gupta et al, Artech House, 1981, App. 2.1 case 7.
[5] Tsironis, C. U.S. Pat. No. 7,135,941, Triple probe automatic slide screw load pull tuner and method.
[6] Tsironis, C. U.S. Pat. No. 7,646,267, "Low frequency electro-mechanical impedance tuner".
[7] Variable Capacitor Datasheet, Ocean State Electronics.
[8] Tsironis, C. U.S. Pat. No. 8,212,629, "Wideband low frequency impedance tuner".

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners in order to synthesize reflection factors (or impedances) at the input and output of said transistors.

A popular method for testing and characterizing microwave components (transistors) for high power operation is "load pull" and "source pull". Load pull or source pull are measurement techniques employing microwave tuners and other microwave test equipment, such as signal sources, power meters and directional couplers. The microwave tuners in particular are used in order to manipulate the microwave impedance conditions under which the Device under Test (DUT, or transistor) is tested (FIG. 1a).

Many users require impedance tuners to cover a wide frequency range. In laboratory environment, in particular, test setups are expensive and applications may vary from low megahertz to high gigahertz frequencies. A tuner unit being able to operate over such wide frequency ranges would then be required, but has not been introduced, yet.

DESCRIPTION OF PRIOR ART

Electro-mechanical impedance tuners are, by their nature, limited in frequency bandwidth. Therefore various techniques must be used to respond to this requirement.

A popular family of electro-mechanical tuners, the "slide-screw tuners", use adjustable RF probes (slugs) inserted into the transmission media of the tuners and capacitively coupled with the central conductor (FIG. 1b) of the transmission media which is, in general, a slotted coaxial or parallel plate airline (slabline); this insertion of the slug reflects part of the power coming out of the DUT and creates a reflection factor (Γ) or impedance (Z) that is presented to the DUT. The relation between reflection factor and impedance is:

$$Z=Zo*(1+\Gamma)/(1-\Gamma); \text{ with } Zo=\text{characteristic impedance (typically=50}\Omega). \quad \{1\}$$

In terms of complex admittance Y, the above relation becomes:

$$Y=1/Z=Yo*(1-\Gamma)/(1+\Gamma); \text{ with } Yo=\text{characteristic admittance (typically 1/50 }\Omega=20\text{ mS).} \quad \{2\}$$

The 'slide-screw' principle is a tuning mechanism where the capacitive coupling between the RF probe and the central conductor of the slotted airline (slabline) creates a wideband reflection factor Γ of which the amplitude can be adjusted by modifying the distance "S" between the probe and the central conductor and therefore changing the value of the capacitance between the central conductor and the RF probe. In order to change the phase of the reflection factor Γ the RF probe, already inserted in the slabline, must be moved horizontally along the axis of the slabline, (FIG. 1b).

The combination of both horizontal and vertical movement of the microwave probe inside the slabline allows the creation of complex reflections factors Γ covering the entire Smith Chart (FIG. 1c). Starting at point "a", which corresponds to no reflection at all, we move the probe close to the central conductor thus creating a reflection and reach point "b". Then we move the probe horizontally and turn on a circle of constant radius on the Smith Chart and reach point "c". This technique allows synthesizing any reflection factor on the Smith Chart, within the tuning range, or maximum VSWR with $VSWR_{max}=(1+|\Gamma_{max}|)/(1-|\Gamma_{max}|)$, of the tuner.

By its nature a metallic probe (slug) in a low loss slabline creates maximum reflection, but has a limited frequency range. The probe has a capacitive effect but does not behave purely as a capacitor, because of electro-magnetic field deformation. Typical bandwidths covered by a single metallic probe are approximately 2-3 octaves (1 octave=$F_{max}/F_{min}$=2), where $F_{max}$ is the maximum and $F_{min}$ the minimum frequency. If we want to cover several octaves using the same tuner we need two probes operating in parallel. This allows a maximum to minimum frequency range of up to 25:1, such as 2 GHz to 50 GHz (FIG. 2b).

To increase the instantaneous bandwidth an extended structure employs three RF probes, in parallel (FIGS. 4a, 4b). As an example such a tuner would be able to cover a frequency range of 0.4 to 18 GHz ($F_{max}/F_{min}$=45:1) or 1 to 50 GHz, a ratio of 50:1. The ultimo limit in bandwidth is mechanical stability of the central conductor of the slotted airline (slabline). The mechanical stability of any unsupported metallic (steel) rod depends on its ratio of total length to diameter. If this ratio exceeds 100:1 then the structure is critical. In the present case, a wideband tuner starting at 0.4 GHz and going through to 18 GHz needs a central conductor with a diameter of 3 mm and a total length of 530 mm; this makes the ratio Length/Diameter=176:1. It is therefore very important not to ignore practical considerations in such an apparatus.

Slide screw tuners require a total horizontal travel length of ½ wavelengths. At 1 GHz this corresponds to 15 cm, at 100 MHz to 150 cm and at 10 MHz to 1,500 cm (15 meters). It is obvious that at frequencies below a few hundred megahertz the size of a slide screw tuner is prohibitive. For this frequency range a different technology is used [6], (FIGS. 6a, 6b, 22), which employs low frequency adjustable capacitors and selected lengths of flexible or semi-rigid coaxial cable between them, allowing this way, controllable high reflection factors from under 10 MHz and up to 1 GHz. The capacitors used are either "trimmer type capacitors" [3] for the higher end of frequencies, or "parallel blade capacitors" [7] for the lower end. The high end starts around 200 MHz and stops at around 1 GHz and the low end starts at around 10 MHz and stops around 200 MHz. At least three capacitors are required in order to tune all over the Smith chart, but, in order to reach continuous coverage of the whole frequency range four or five capacitors and associated transmission lines may be used (FIGS. 6a, 6b).

A capacitor/transmission line based tuner is based on the principle, that at least three reflection vectors of adjustable size but fixed angle between them can synthesize a resulting reflection factor vector, which covers a large portion of the Smith chart (FIG. 8). Because the angle between vectors is fixed the bandwidth of said tuner is limited and the maximum reflection created is not fully flat over the whole frequency range. If three capacitor/line sections are insufficient, because of the ripple in S11max, which is caused by the fact that the phase of the cable sections is not 60 degrees for all frequencies, a fourth or even fifth section can be added to compensate and cover the missing zones of frequency and reflection factor. The tuning mechanism is sketched in FIGS. 7, 8.

BRIEF DESCRIPTION OF THE SEVERAL VIEWS OF THE DRAWINGS

The invention and its mode of operation will be more clearly understood from the following detailed description when read with the appended drawings in which:

FIG. 1, depicts prior art: a) typical load pull setup using impedance tuners; b) Cross section of electro-mechanical slide screw tuner; c) prior art: Tuning mechanism of slide screw tuner.

FIG. 2, depicts prior art: a) triple probe tuner for ultra stable and harmonic tuning; b) wideband tuner using two RF probes, one small probe for high frequencies and one large probe for low frequencies.

FIG. 3, depicts prior art: a) frequency response of triple (identical probes) and b) double (different probes) tuners.

FIG. 4, depicts prior art: a) Wideband tuner with triple carriage and three probes of different size covering adjacent frequency bands b).

FIG. 5, depicts a Cascade of two tuners covering different frequency ranges, allows extending the overall bandwidth; the high frequency tuner is also shorter (L1<L2) because of the shorter wavelength.

FIG. 6, depicts three (a) (prior art) and four (b) "variable capacitor-transmission line" low frequency tuners. Higher number of sections provides better bandwidth and tuning flatness. Transmission lines are flexible or semi-rigid coaxial cables wound in coil form in order to reduce overall tuner size.

FIG. 7, depicts the frequency response of three (prior art) and five capacitor-line section, low frequency tuners FIG. 8, depicts the impedance coverage of three capacitor-line section tuner (sections a, b, c) and improvement of coverage due to a fourth capacitor-line section (d).

FIG. 9, depicts prior art: Parallel blade and trimmer capacitors and their electrical RF equivalent circuit indicating the maximum operation frequency: Freq-Max. Beyond this frequency the capacitors act like inductances. Trimmer capacitors operate up to about 1000 MHz, whereas parallel blade capacitors can go up to 150 MHz, always depending on Cmax.

FIG. 10, depicts prior art: structure of low frequency tuner using three variable parallel blade capacitors and three lengths of coaxial cable (the last section L4 of cable is not useable for tuning purposes); parallel blade capacitors operate at lower frequencies. The lengths of coaxial cable can be wound in coil-form in order to reduce the overall length.

FIG. 11, depicts prior art: automated low frequency tuner, using stepper motors.

FIG. 12, depicts the residual reflection of capacitor based low frequency tuner as a function of frequency, over a wide frequency range, reaching beyond the tuner's operating bandwidth (cross-over frequency).

FIG. 13, depicts the typical maximum and residual reflection of low frequency and high frequency tuners over the whole frequency range of the cascade of two tuners.

FIG. 14, depicts the tuning capability of a cascade of a high frequency with a low frequency (with high residual reflection) tuner.

FIG. 15, depicts a) a cascade of two impedance tuners [a] and [b] with possibility of bypassing the low frequency unit using a capacitor. Γ1 and Γ2 are the reflection factors at the test port of each module; b) the equivalent circuit used to demonstrate the effect of the bypass capacitor C.

FIG. 16, depicts a) a cascade of two impedance tuners [a] and [b] with possibility of bypassing the low frequency unit using a switchable capacitor C. b) The cascade of two impedance tuners [a] and [b] with possibility of bypassing the low frequency unit using a permanent capacitor C; c) the wideband frequency response of residual reflection of low frequency tuner, with and without bypass capacitor.

FIG. 17, depicts the structure of a wideband tuner using a cascade of a slide screw tuner and a low frequency tuner with three variable trimmer capacitors and three lengths of coaxial cable; trimmer capacitors operate at high end of megahertz frequencies.

FIG. 18, depicts the structure of a wideband tuner using a cascade of a wideband slide screw tuner with three probes and a low frequency tuner with three variable parallel blade capacitors and three lengths of coaxial cable; parallel blade capacitors operate at the low end of megahertz frequencies; the low frequency tuner module can be bypassed by an appropriate capacitor.

FIG. 19, depicts a wideband tuner using a cascade of a slide screw tuner with two probes and a low frequency tuner with four variable parallel blade capacitors and four lengths of coaxial cable.

FIG. 20, depicts a cascade of three tuner units, providing multi-decade frequency coverage FIG. 21, depicts a cascade of a trimmer based tuner with a parallel-blade capacitor tuner; the parallel-blade capacitor tuner can be bypassed using an (optional) bypass capacitor in order to reduce off-band residual reflections.

FIG. 22, depicts prior art, the structure of low frequency tuner using a variable capacitor (parallel-blade [7] or trimmer [3], depending on the frequency range) and a variable in-line phase shifter [8].

FIG. 23, depicts the structure of a wideband tuner using a cascade of a slide screw tuner and a low frequency tuner with three variable trimmer capacitors and three lengths of coaxial cable; the low frequency tuner can be bypassed using an (optional) bypass capacitor, in order to reduce its residual reflection at high frequencies.

FIG. 24, depicts the cascade of a wideband high frequency tuner with a low frequency tuner and capability of inserting a bypass capacitor.

FIG. 25, depicts a compact assembly of slide screw with capacitor based wideband tuners (top view).

FIG. 26, depicts prior art, a test setup for calibrating an impedance tuner on a vector network analyzer (VNA).

DETAILED DESCRIPTION OF THE INVENTION

This invention describes a microwave impedance tuner apparatus which covers instantaneously a very large frequency bandwidth of up to 10 or 16 octaves or up to 3.6 decades (10 or 50 MHz to 6, 18, 40 or 50 GHz). Such an endeavor has never been considered before. In fact it is possible, when appropriate technologies are used and are combined with associated tuning algorithms, which allow the tuners in cascade to compensate for each-other's residual reflections. In order to understand this operation we need to review the residual reflections of the low frequency tuners at high frequencies (FIGS. 7, 12). Also in order to avoid intrinsic reflections due to the coaxial RF connectors, which have upper frequency limits (cut-off frequencies) all tuners in the cascade must be equipped with connectors which allow signal flow at the highest frequency; for instance, if the highest frequency is 6 GHz we can use either 7/16, N or APC7 (7 mm) coaxial connectors. For 18 GHz we must use either N-type or 7 mm connectors. For 40 GHz we must use either 2.4 mm or 2.9 mm (K) connectors. For 50 GHz we must use 2.4 mm connectors. Beyond the connector's residual reflection (which can be eliminated by selecting the proper connector type) internal residual reflections occur, due to the internal components of the low frequency tuners, which require special treatment, using appropriate circuitry and tuning algorithms.

One possible extension of frequency band uses tuners covering different bandwidths and consists in cascading two such tuners (FIG. 5); said tuners may cover adjacent but also non-adjacent frequency bands. The purpose of such a configuration would be to use a once assembled test setup for a wide frequency range without swapping tuners or recalibrating all the components and the tuners separately.

The main technical difficulty is rather in the low frequency tuners [6, 8]. Said low frequency tuners can be made using three or more variable capacitors and associated pre-selected and fixed sections of flexible or semi-rigid coaxial cable (FIGS. 6a, 6b, 10, 22). In the simplest case of three capacitors and coaxial cables the frequency coverage is not fully flat (FIG. 7); in order to create a fully flat frequency response a larger number of capacitor-line sections are required (FIGS. 6b, 7). In all cases the capacitor positions are registered in tuner calibration files with the associated s-parameters of the tuner itself at all frequencies of interest. Said calibration data are then used for later tuning purposes. The capacitors are controlled using stepper motors (FIGS. 11, 25). Said stepper motors are controlled by a system computer running appropriate control software.

An alternative structure for low frequency tuners is shown in FIG. 22. It consists of a linear phase shifter ahead of a shunt variable capacitor. The capacitor creates a reflection factor vector at any given frequency and the phase shifter rotates this vector to cover most of the Smith chart. Manufacturing of low frequency linear phase shifters has been described in [8].

In all tuner structures operating in the megahertz frequency range and using variable capacitors, being it parallel-blade or trimmer capacitors the main limitation is self-resonance of the capacitors themselves. This comes from the fact that any signal leads from the internal capacitor structure, via the capacitor contacts, to the transmission lines act as parasitic series inductors (FIG. 9). Said parasitic inductors Ls will create a series resonance with the capacitance at a given frequency, which depends on the value of the parasitic inductance and the maximum value of the capacitance Cmax itself as follows in equation {3}; this "resonance frequency" is in fact the maximum frequency of operation of this particular capacitor in the specific configuration assembled:

$$\text{Resonance Frequency: Freq-Max}=1/(2\pi\cdot\text{sqrt}(Ls*C\text{max})) \quad \{3\}$$

Depending on the internal structure of each capacitor said resonance frequency may vary from a few megahertz up to a few gigahertz. What is important in the whole structure is the minimum impedance (or maximum reflection factor) that can be created at the lowest frequency of operation, using any particular capacitor. Parallel-blade capacitors may reach a couple of hundred megahertz maximum frequency whereas trimmer capacitors can still operate beyond one gigahertz. The minimum impedance attainable occurs at the lowest frequency and follows the relation:

$$Z\text{Min}=1/(2\pi*\text{Freq-min}*C\text{max}) \quad \{4\}$$

For instance, at 10 MHz in order to create a 55Ω impedance a capacitor with Cmax=3.18 nano-farad (nF)=3,180 pico-farad (pF) is required. Such capacitors have resonance frequencies in the range of 100 MHz. What is important also is to realize that the necessary low impedance can be reached at higher frequencies with the capacitors set not to the position of maximum capacitance. In the above example the capacitance needed for 55Ω at 100 MHz would be 10 times smaller, i.e. 318 pF, in which case the resonance frequency would (ideally) be approximately 3 times higher (eq. {3} postulates that max-freq follows a square root (sqrt) rule with Cmax).

The major obstacle, though, in making the cascade of high frequency (slide screw) tuners with capacitor based low frequency tuners able to synthesize impedances over a wide frequency range, well within each said tuner's range, is the residual reflection of said low frequency tuners shown on a Smith chart in FIGS. 12, 13. As FIG. 13 also shows, slide screw (high frequency) tuners have a much lower residual reflection factor at low frequencies; whereas low frequency tuners have a much higher one. This high end residual reflection does not change much when the low frequency tuner is set to maximum or minimum reflection (i.e. when the capacitors are set to maximum or minimum capacitance), because it is due to the internal fixed parts and components of the tuners themselves. Tuning with such a component is not obvious, as shows FIG. 14.

What the tuning operation comes down to, is that, tuning with a cascade of inhomogeneous tuners, like the present apparatus (FIG. 15a), means, first of all, acquiring the required calibration data for all tuners at all frequencies and then tuning with all (two or three) tuners at the same time in the following steps: after selecting the frequency of operation, it has to be decided which tuner will perform the tuning, i.e. in which' tuners frequency range the selected frequency falls; if the selected frequency falls inside the lowest frequency's tuner range then the highest frequency tuner (the slide screw tuner) will have all its probes retracted from the transmission line, because said transmission line has a perfect low-pass behavior, i.e. it does not create noticeable reflections at low frequencies (FIG. 13); this is normally always the case, since slide screw tuners have always perfect low pass behavior. Tuning consists in synthesizing the reflection factor Γ1 at the test port of the tuner cascade deliberately; the reflection factor Γ1 at the test port of any tuner is a function of its actual scattering (s-) parameters {S11, S12, S21, S22} and the actual load Γ2, following the relation (FIG. 15a):

$$\Gamma1 = S11 + (S12*S21*\Gamma2)/(1 - S22*\Gamma2) \qquad \{5\}$$

The s-parameters themselves change, of course, when the tuner moves. As S11 increases S21 decreases. In fact, all passive networks, except circulators (which use magnetic spin effects [isolators]) are "reciprocal", i.e. their transmission s-parameters S12 and S21 are equal (S12=S21). Overall a passive network cannot produce gain, so the relation describing the gain must always be valid:

$$Gain = |S21|^2/(1 - |S11|^2) \qquad \{6\}$$

When the tuner is initialized, S11≈0 and S21=S12≈1. When S11=0.9, then typical values of S21=S12 are 0.35, yielding a typical 2 dB tuner loss (eq. (2)). The effect of reducing S12=S21 is that the load reflection factor in equation {1} does not affect as much the overall tuner reflection Γ1. (FIGS. 14, 15a). High S11 tuning "masks" the effect of the mismatched load and tuning range is reduced in the area opposite to the residual load reflection Γ2, but is instead increased in the direction of said load vector (Γ2). It is therefore possible to create a very wideband tuner, even if the low frequency units generate high residual reflections.

The effect of the low frequency tuner can be either partly compensated when a fixed capacitor of appropriate value is connected, either permanently or temporarily (with the help of an RF switch) between the tuner test port and the load (FIGS. 15a, 21, 23, 24). This technique can be applied for all tuner configurations, where one unit has a non-negligible residual reflection, or it cannot be driven to synthesize a small reflection at the selected (high) frequency, such as to allow the first (high frequency) tuner to tune to all desired impedances (FIGS. 14,16).

FIG. 15b shows why the bypassing capacitor C (impedance Zc=1/jωC) is an effective solution to the residual reflection of low frequency tuners at high frequencies: the capacitors inside the low frequency tuners act as series resonances (SR1, SR2 in FIG. 15b), which, at frequencies above the cut-off frequency fco become inductive. In this case the (optional and/or switchable) bypass capacitor C, followed by a resistor of 50Ω, will collect the "z" part of the signal injected into node (X) and allow the "y" part to reach the test port of the low frequency tuner. This way the load impedance, seen by the high frequency tuner at its output port will be driven towards 50Ω with increasing frequency. The tuning algorithm uses calibration data to determine at what state the low frequency tuner must be set to allow the best matching conditions (=50Ω) for this to happen. The side-effect of this operation is an increased (low frequency) tuner loss, but this can be taken care of accurately using calibration data. Insertion loss of load tuners is irrelevant, what is important is their reflection factor and how this can be maximized.

In addition to the configuration of FIG. 15a where the bypass capacitor is connected at the test port of the low frequency tuner towards ground, an alternative setup provides for such a bypass capacitor to be connected between the test port of the low frequency tuner and the load directly (FIG. 16a), with a provision of having the idle port of said low frequency tuner disconnected, if the impedance of said tuner at said idle port is low, compared with 50Ω. If said impedance at the idle port is high compared with 50Ω, then the idle port may remain connected. This setup works best when the low frequency tuner has high internal impedance at both, the test and idle ports; this depends on the capacitor settings of said low frequency tuner, which are saved as part of the calibration data file, as described later. It also depends on the fringe elements associated with connecting low frequency capacitors to coaxial cables and internal parasitic elements of said capacitors, which will appear at high frequencies.

The analytic equations describing the cascade of two tuners (tuner (a) and tuner (b)) and the effect of bypassing the lower frequency unit using a capacitor C (FIGS. 15a, 16a) are as follows:

$$\Gamma1 = S11a + (S12a*S21a*\Gamma2)/(1 - S22a*\Gamma2) \qquad \{7\}$$

With open capacitor: 
$$\Gamma2 = S11b + (S21b*S12b*\Gamma_L)/(1 - S22b*\Gamma_L) \qquad \{8\}$$

The effect of the bypassing capacitor can be seen in FIGS. 15b, 16; it shows a flattening and subsequent reduction of residual reflection factor above the cross-over frequency.

For the overall tuner to operate, though, specific tuning routines must be used, which will take into consideration residual mismatch of the low frequency units. In a first step said low frequency units must also be fully characterized (calibrated) at the highest frequencies. This will allow the tuning algorithms to determine the best probe or capacitor positions for as small a residual reflection at the higher frequencies as possible. So, it is not so that we can simply initialize the low frequency units and operate only the high frequency ones. The tuning routine must try to tune to Γ2=0 at the high frequency. If this is not possible, which will be normal, then the next best position must be chosen and the low frequency unit be set to it. Then the actual Γ2≠0 is introduced in the equation {5} and the high frequency tuner tunes after taking the mismatched load into consideration.

As stated before, low frequency tuners using shunt capacitors and coaxial lines have a bad high pass behavior, i.e. they present a high residual reflection at high frequencies. This would shift the tuning range of the high frequency tuner (FIG. 14) and it may or may not allow proper tuning in all areas of the Smith chart. In order to smooth out said high frequency residual reflection of said low frequency tuners we use a capacitor, bridging over the low frequency tuner, between said tuner's test port and output port (FIGS. 15a, 15b).

The bypassing capacitor must be selected such as not to short-circuit the tuning capacity of the low frequency tuner itself, though. This may not be obvious in the region of the cross-over frequency (FIG. 16c). Cross-over frequency is defined as the frequency at which the low frequency tuner stops operating and the high frequency tuner takes over. Depending on the actual RF behaviour of each tuner said parallel capacitor may be changed or even removed from the network using RF plugs or switches (FIGS. 15a, 21, 23, 24), or more than one capacitor can be used to adapt to the various frequency ranges. All this will be decided once all tuners are calibrated and the tuning algorithm executes the task of tuning, in which case the tuning capacity of the system can be concretely assessed. In general, the bypass capacitor technique is most effective when the low frequency tuner is tuned to the highest impedance at the test and idle ports (FIG. 16b). This may be when the capacitors are set to their smallest values, or to some other value that creates high impedance parallel resonance. For the tuner operation this is irrelevant, because the calibration data contain a full characterization of the low frequency tuner and allow the tuning algorithm to select the best settings for this purpose.

Regarding the overall size of the wideband tuner, the point is that, only the slide-screw type tuner section requires a straight precision slotted airline as transmission media; the length of said airline is slightly larger than half a wavelength at the lowest frequency; a, mechanically acceptable length being 25 cm (corresponding to a minimum frequency of 800 MHz approximately; this includes horizontal free travel of the RF tuner probe plus some length for sidewalls, moving gear etc.), we need capacitor based tuners for frequencies up to 800 MHz, approximately. These lower frequency tuners then use three or more capacitance sections, but the coaxial cable connecting said sections is usually semi-rigid or flexible and can be would in coil form to a highly reduced overall length. This allows said lower frequency tuners to be extremely compact, despite the required overall transmission line lengths, which may exceed one or two wavelengths. Favorable in this context is also the fact that said coaxial flexible cables use some low loss dielectric to secure the central conductor and this reduces the effective physical length of said cables by a factor of sqrt ($\in_r$); $\in_r$ being the dielectric constant of the insulator material inside said coaxial cables (FIG. 25).

FIGS. 17 to 21 and 23, 24 show various possible configurations using combinations of slide screw (high frequency) tuners and capacitor based (low frequency) tuners, said low frequency tuners using either parallel blade or trimmer capacitors. Possible configurations of parallel blade and trimmer based capacitor tuners are shown as well, those latter configurations allowing coverage from the low megahertz frequencies up to several hundred megahertz or low gigahertz range. In fact, as long as attention is being paid to accommodate for high frequency tuning in view of the high residual reflection of the low frequency tuners, any combination of said low and high frequency tuners is viable.

The same is valid when an alternative configuration of low frequency tuner is used (FIG. 22). This configuration uses a serial adjustable phase shifter and a variable shunt capacitor [8]. This configuration is more promising than the three (or four) capacitor configuration with fixed coaxial cable sections. It is so because the frequency coverage is flatter and the fringe components are less, which creates lower reflection factor at high frequencies; however, the linear phase shifter is harder to manufacture at low frequencies [8].

FIG. 25 shows, schematically, the compact assembly of the slide screw (high frequency) with the capacitor based (low frequency) tuners. Said configuration may cover 50 MHz to 18 GHz and would, otherwise require a linear length of more than 3 meters, whereas the assembly shown in FIG. 25 is only around 40×40 cm$^2$, a typical size for a laboratory instrument; the lower the lowest frequency, of course, the higher the gains in size.

Calibrating the tuner(s) consists in simply connecting them, individually or as a cascade to a pre-calibrated vector network analyzer and measuring their four s-parameters as a function of their positions (FIG. 26). Said calibration and tuning methodology at the level of each individual tuner and associated algorithms have been described before [2, 5 and 6].

Due to residual reflection of the low frequency tuning modules at frequencies inside the high frequency band (FIG. 16c) it is preferable to calibrate the tuner modules separately when operating at frequencies in the high frequency band. Otherwise the scaling required to create concentric calibration circles on the Smith chart will be deformed (FIG. 14). In this case the high frequency calibration points will be better distributed (FIG. 1c) and can be cascaded numerically with the residual low frequency module impedance (FIG. 12) later.

When operating in the low frequency band the tuner modules can be calibrated together (FIGS. 17, to 20, 25 and 26); this is possible because the transmission line of the high frequency module has no low cut-off frequency and very low reflection and insertion loss down to DC (FIG. 1b).

The present embodiment of this invention can easily be adapted to use other types of mechanical variable capacitors and phase shifters as well as combinations of tuners for various frequencies in order to become ultra wideband; this shall not limit the basic idea and the overall scope of the present invention, of using cascades of different-frequency tuners in order to increase instantaneous frequency bandwidth.

What I claim as my invention is:

1. A calibration method for multi frequency-range impedance tuners,
    said tuners comprising a cascade of at least two tuning modules, each said module capable of creating controllable reflection factor in a distinct frequency range,
    said distinct frequency ranges being in the MHz region and the GHz region,
    said tuners in the GHz region being slide screw tuners and said tuners in the MHz region being Line-Capacitor (LC) tuners,
    said slide screw tuners comprising an input (test) port and an output (idle) port and a slotted airline (slabline) between said ports, and one or more mobile carriages travelling across said slabline,
    said carriages carrying metallic tuning probes capacitively coupled with the center conductor and adjustable, inside the slot of said slabline, at various distances from said center conductor whereby creating adjustable reflection factor in the GHz frequency range,
    and whereby said LC tuners comprising at least three mechanically adjustable shunt variable capacitors being inter-connected using sections of coaxial cable, and having a common ground terminal,
    whereby adjusting the capacitance of said shunt capacitors creates adjustable reflection factor in the MHz frequency range,
    whereby said slide screw tuner module of the cascade is connected on the side closest to the DUT,
    and whereby said LC tuners are bypassed in the GHz frequency range by a bypass network creating low reflection at GHz frequencies,
    said MHz and GHz range tuner modules being remotely controllable using associated gear, stepper motors, motor control circuitry and interface to a control processor,
    and whereby each said tuner module is calibrated individually at all frequencies of interest, including frequencies outside the range of said module,
    said calibration procedure comprising measuring scattering (S-) parameters of each said tuner module separately for a plurality of tuner states using a vector network analyzer and saved in tuner calibration files.

2. A tuner calibration method as in claim 1, at a frequency inside the range of the high frequency (slide screw) tuner module comprising the following steps:
    a) S-parameters of said slide screw tuner module(s) are measured at a plurality of horizontal and vertical positions of said tuning probes, whereby the reflection factor at the test port covers a maximum area of the Smith chart, and saved in calibration files;
    b) S-parameters of said low frequency module are measured for a plurality of capacitor positions from minimum to maximum capacitance value and saved in calibration files;
    c) S-parameters measured in steps a) and b) are cascaded and saved in an overall tuner calibration file ready for retrieval.

3. A tuning algorithm uses calibration data base created in claim 2 and synthesizes user defined reflection factors (impedances) for frequencies in the range of the high frequency tuner module, by searching in said calibration data base and positioning the tuning probe inside said slabline, in four steps:
- i) a computer routine searches among the calibrated states of the low frequency module, identifies said state which is closest to a reflection factor of zero (50 Ohms) and saves the S-parameters of said state;
- ii) the S-parameters of all calibrated states of said high frequency module are cascaded to the S-parameters found in step i) and saved;
- iii) a computer routine searches among the S-parameters generated in step ii) for the reflection factor (S11 of the cascade) closest to the user defined target reflection factor and saves the probe coordinates of said state;
- iv) the probe of said high frequency module is positioned to the coordinates found in step iii).

4. A tuner calibration method as in claim 1, at a frequency inside the range of the LC tuner module comprising the following steps:
- d) S-parameters of said slide screw tuner module(s) are measured once, when all probes are retracted (initialized) and saved;
- e) S-parameters of the LC tuner module(s) are measured for a plurality of positions of said capacitors from minimum to maximum capacitance value and saved in calibration data files.
- f) S-parameters measured in steps d) and e) are cascaded and saved in an overall tuner calibration file ready for retrieval.

5. A tuning algorithm uses said calibration data base created in claim 4 and synthesizes user defined reflection factors (impedances) for frequencies in the range of the low frequency tuner module, by searching in said calibration data base and positioning the capacitors of said LC (low frequency) tuner module, in three steps:
- v) the S-parameters of all calibrated states (capacitor positions) of said low frequency module are cascaded with the S-parameters of said high frequency module;
- vi) a computer routine searches among the S-parameters generated in step v) for the reflection factor (S11 of the cascade) closest to the user defined target reflection factor and saves the capacitor positions of said state;
- vii) the capacitors of said low frequency module are positioned to the positions found in step vi).

6. A calibration method as in claim 1, whereby said tuner module(s) operating in the MHz frequency region (Phase Shifter Capacitor: PSC-tuners) comprise an input (test) port and an output (idle) port and a variable phase shifter between said ports,
whereby the input terminal of said phase shifter is the tuner input (test) port and the output terminal of said phase shifter is the tuner output (idle) port,
and a variable shunt capacitor connected between the output terminal of said phase shifter and ground,
and whereby said PSC tuners are bypassed in the GHz frequency range by a bypass network creating low reflection at GHz frequencies,
said PSC tune module being remotely controllable using associated gear, stepper motors, motor control circuitry and interface to a control processor.

7. A tuner calibration method as in claim 6, at a frequency inside the range of the slide screw tuner module comprising the following steps:
- g) S-parameters of said slide screw tuner module(s) are measured at a plurality of horizontal and vertical positions of said tuning probes, whereby the reflection factor at the test port covers a maximum area of the Smith chart, and saved in calibration files;
- h) S-parameters of said low frequency module are measured for a plurality of capacitor positions from minimum to maximum capacitance value and phase shifter positions to cover at least 360 reflection factor degrees and saved in calibration files;
- i) S-parameters measured in steps g) and h) are cascaded and saved in an overall tuner calibration file ready for retrieval.

8. A tuner calibration method as in claim 6, at a frequency inside the range of the LC tuner module comprising the following steps:
- j) S-parameters of said slide screw tuner module(s) are measured once, when all probes are retracted (initialized) and saved;
- k) S-parameters of the PSC tuner module(s) are measured for a plurality of said capacitors positions from minimum to maximum capacitance value and phase shifter positions to cover at least 360 reflection factor degrees and saved in calibration files.
- l) S-parameters measured in steps j) and k) are cascaded and saved in an overall tuner calibration file ready for retrieval.

9. A tuning algorithm uses said calibration data base created in claim 8 and synthesizes user defined reflection factors (impedances) for frequencies in the range of the low frequency tuner module, by searching in said calibration data base and positioning the phase shifter and the capacitor of said PSC (low frequency) tuner module, in three steps:
- viii) the S-parameters of all calibrated states (phase shifter and capacitor positions) of said low frequency module are cascaded with the S-parameters of said high frequency module,
  whereby said S-parameters of said high frequency module were measured when the tuning probe(s) were withdrawn (initialized), and saved;
- ix) a computer routine searches among the S-parameters generated in step viii) for the reflection factor (S11 of the cascade) closest to the user defined target reflection factor and saves the phase shifter and capacitor positions of said state;
- x) the phase shifter and capacitor of said low frequency module are positioned at the positions found in step ix).

* * * * *